(12) United States Patent
Hatamian

(10) Patent No.: US 6,272,173 B1
(45) Date of Patent: *Aug. 7, 2001

(54) EFFICIENT FIR FILTER FOR HIGH-SPEED COMMUNICATION

(75) Inventor: Mehdi Hatamian, Mission Viejo, CA (US)

(73) Assignee: Broadcom Corporation, Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/437,722

(22) Filed: Nov. 9, 1999

Related U.S. Application Data

(60) Provisional application No. 60/107,877, filed on Nov. 9, 1998, provisional application No. 60/108,319, filed on Nov. 13, 1998, and provisional application No. 60/130,616, filed on Apr. 22, 1999.

(51) Int. Cl.$^7$ .............................. H03H 7/30; H03K 5/159
(52) U.S. Cl. ......................... 375/229; 375/233; 375/350; 708/319
(58) Field of Search .................................... 375/232, 233, 375/229, 230, 350; 708/300, 322, 323, 319; 455/307, 295; 333/18, 28 R; 370/290, 291, 201; 379/411

(56) References Cited

U.S. PATENT DOCUMENTS

| | | | |
|---|---|---|---|
| 5,031,133 | * | 7/1991 | Sasaki .................................. 708/319 |
| 5,479,363 | * | 12/1995 | Willson, Jr. et al. ................ 708/319 |
| 6,131,105 | * | 10/2000 | Pajarre et al. ....................... 708/319 |

FOREIGN PATENT DOCUMENTS

WO 98/43369   10/1998   (WO).

OTHER PUBLICATIONS

Duncan et al.: "Strategies for design automation of high speed digital filters" Journal of VLSI Signal Processing, vol. 9, No. ½, Sep. 1995 pp. 105–118, XP000525889, Dordrecht, NL.

Caraiscos, Pekmestzi: "Low–latency bit–parallel systolic VLSI implementation of FIR digital filters" IEEE Transactions on Circuits and Systems II: Analog and Digital Signal Processing, vol. 43, No. 7, Jul. 1996, pp. 529–534, XP000630793 New York, US, ISSN: 1057–7130.

Pekmestzi, Caraiscos: "Implementation of systolic multipliers and digital filters via signal flow–graph transformations" The Mediterranean Electrotechnical Conference, Apr. 12–14, 1994, pp. 105–108, XP000506110, New York, US ISBN: 0–7803–1773–4.

(List continued on next page.)

Primary Examiner—Stephen Chin
Assistant Examiner—Betsy L. Deppe
(74) Attorney, Agent, or Firm—Christie, Parker & Hale, LLP

(57) ABSTRACT

A method for reducing a propagation delay of a digital filter. The digital filter has an input path and an output path and includes a set of delay elements and a number of taps. The taps couples the input path to the output path. Each of the taps includes a coefficient, a multiplier and an adder. Each of the delay elements is disposed between two adjacent taps. The delay elements are placed in both the input path and the output path of the digital filter, such that the digital filter has fewer delay elements in the input path than a direct-form digital filter having the same number of taps in a direct-form structure and has fewer delay elements in the output path than a transposed-form digital filter having the same number of taps in a transposed-form structure, and such that the digital filter has same transfer function as the direct-form digital filter and the transposed-form digital filter.

20 Claims, 3 Drawing Sheets

OTHER PUBLICATIONS

Level One Communications, Inc., Combined Parallel Adaptive Equalizer/Echo Canceller, WO 98/43369 A, International Publication Date Oct. 1, 1998.

IEEE Std 802.3ab–1999 (Supplement to IEEE Std 802.3, 1998 Edition), entitled Supplement to Carrier Sense Multiple Access with Collision Detection (CSMA/CD) Access Method and Physical Layer Specifications—Physical Layer Parameters and Specifications for 1000 Mb/s Operation Over 4–Pair of Category 5 Balanced Copper Cabling, Type 1000BASE–T.

Mehdi Hatamian et al., Design Considerations for Gigabit Ethernet 100Base–T Twisted Pair Transceivers, IEEE 1998 Custom Integrated Circuits Conference, 15.1.1–15.1.8.

* cited by examiner

EFFICIENT FIR FILTER FOR HIGH-SPEED COMMUNICATION

CROSS-REFERENCE TO RELATED APPLICATIONS

The present application claims priority on the basis of the following provisional applications, the contents of each of which are herein incorporated by reference: Ser. No. 60/107,877 entitled "Direct-Transposed FIR Filter" filed on Nov. 09, 1998, Ser. No. 60/108,319 entitled "Gigabit Ethernet Transceiver" filed on Nov. 13, 1996, and Ser. No. 60/130,616 entitled "Multi-Pair Gigabit Ethernet Transceiver" filed on Apr. 22, 1999.

The present application is related to the following co-pending applications filed on the same day as the present application and assigned to the same assignee, the contents of each of which are herein incorporated by reference: Ser. No. 09/437,725 entitled "Dynamic Register with Low-Clock Rate Testing Capability" and Ser. No. 09/437,719 entitled "Multi-Pair Gigabit Ethernet Transceiver".

BACKGROUND OF THE INVENTION

1. Field of the Invention

The present invention relates generally to methods and systems for increasing efficiency of a filter in a communication system. More particularly, the invention relates to a method and a system for reducing propagation delay and power consumption of a finite impulse response (FIR) filter in a high-speed communication system.

2. Description of Related Art

In a Gigabit Ethernet communication system that conforms to the IEEE 802.3ab (also termed 1000BASE-T) standard, gigabit transceivers are connected via four Category 5 twisted pairs of copper cables. Symbol data are transmitted at the rate of 250 megabits per second (Mbps) on each twisted pair of copper cable.

A Gigabit Ethernet transceiver includes a larger number of digital filters, which in turn require a large number of registers. The registers operate at the clock rate of 125 megahertz (MHz) and have large number of taps. If the propagation delay of a filter exceeds the clock period then the filter is not useable.

Thus, there is a need for an efficient digital filter for use in a high speed communication system.

SUMMARY OF THE INVENTION

The present invention provides a method for reducing a propagation delay of a digital filter. The digital filter has an input path and an output path and includes a set of delay elements and a number of taps. The taps couples the input path to the output path. Each of the taps includes a coefficient, a multiplier and an adder. Each of the delay elements is disposed between two adjacent taps. The delay elements are placed in both the input path and the output path of the digital filter, such that the digital filter has fewer delay elements in the input path than a direct-form digital filter having the same number of taps in a direct-form structure and has fewer delay elements in the output path than a transposed-form digital filter having the same number of taps in a transposed-form structure, and such that the digital filter has same transfer function as the direct-form digital filter and the transposed-form digital filter.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE INVENTION

The present invention provides a method and a filter structure for reducing a propagation delay of a digital filter. The digital filter has an input path and an output path and includes a set of delay elements and a number of taps. The taps couples the input path to the output path. Each of the taps includes a coefficient, a multiplier and an adder. Each of the delay elements is disposed between two adjacent taps. In a direct-form structure, all the delay elements are placed in the input path. In the transposed-form structure, all the delay elements are placed on the output path. In the filter structure of the present invention, the delay elements are placed in both the input path and the output path of the digital filter. This structure allows the filter to be more efficient than the traditional structures in a high speed communication system.

Digital filters with large number of taps are included in a Gigabit Ethernet transceiver of a communication system. For ease of explanation, the present invention will be described in detail as applied to this exemplary application. However, this is not to be construed as a limitation of the present invention.

Figure 1:
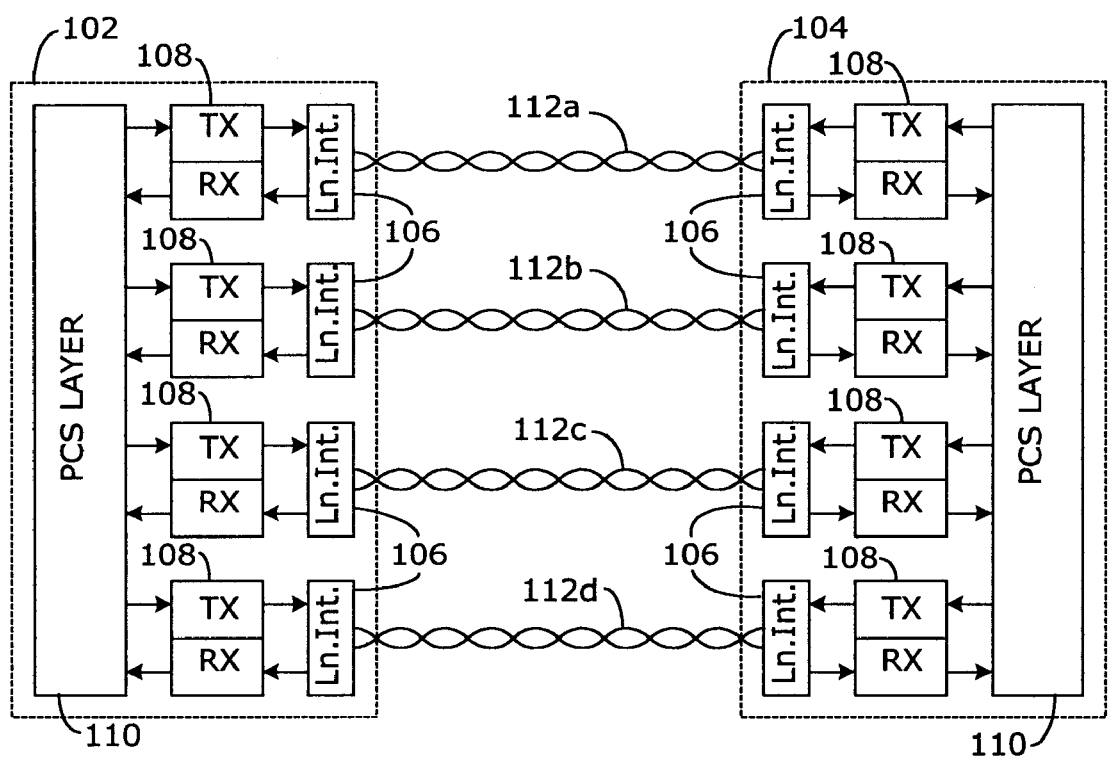
FIG. 1 is a simplified block diagram of a high-speed communication system including two gigabit transceivers configured to communicate over multiple twisted pair wiring channels.

In order to appreciate the advantages of the present invention, it will be beneficial to describe the invention in the context of an exemplary bidirectional communication device, such as an Ethernet transceiver. The particular exemplary implementation chosen is depicted in FIG. 1, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires. The communication system illustrated in FIG. 1 is represented as a point-to-point system, in order to simplify the explanation, and includes two main transceiver blocks 102 and 104, coupled together via four twisted-pair cables 112a, b, c and d. Each of the wire pairs 112a, b, c, d is coupled to each of the transceiver blocks 102, 104 through a respective one of four line interface circuits 106. Each of the wire pairs 112a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 102 and 104, the four constituent transceivers 108 are capable of operating simultaneously at 250 megabits of information data per second (Mb/s) each, and are coupled to the corresponding remote constituent transceivers through respective line interface circuits to facilitate full-duplex bidirectional operation. Thus, 1 Gb/s communication throughput of each of the transceiver blocks 102 and 104 is achieved by using four 250 Mb/s (125 Mbaud at 2 information data bits per symbol) constituent transceivers 108 for each of the transceiver blocks 102, 104 and four pairs of twisted copper cables to connect the two transceiver blocks 102, 104 together.

The exemplary communication system of FIG. 1 has a superficial resemblance to a 100BASE-T4 system, but is configured to operate at ten times the bit rate. As such, it should be understood that certain system performance characteristics, such as sampling rates and the like, will be consequently higher and cause a greater degree of power consumption. Also, at gigabit data rates over potentially noisy channels, a proportionately greater degree of signal processing is required in many instances to insure an adequate degree of signal fidelity and quality.

Figure 2:
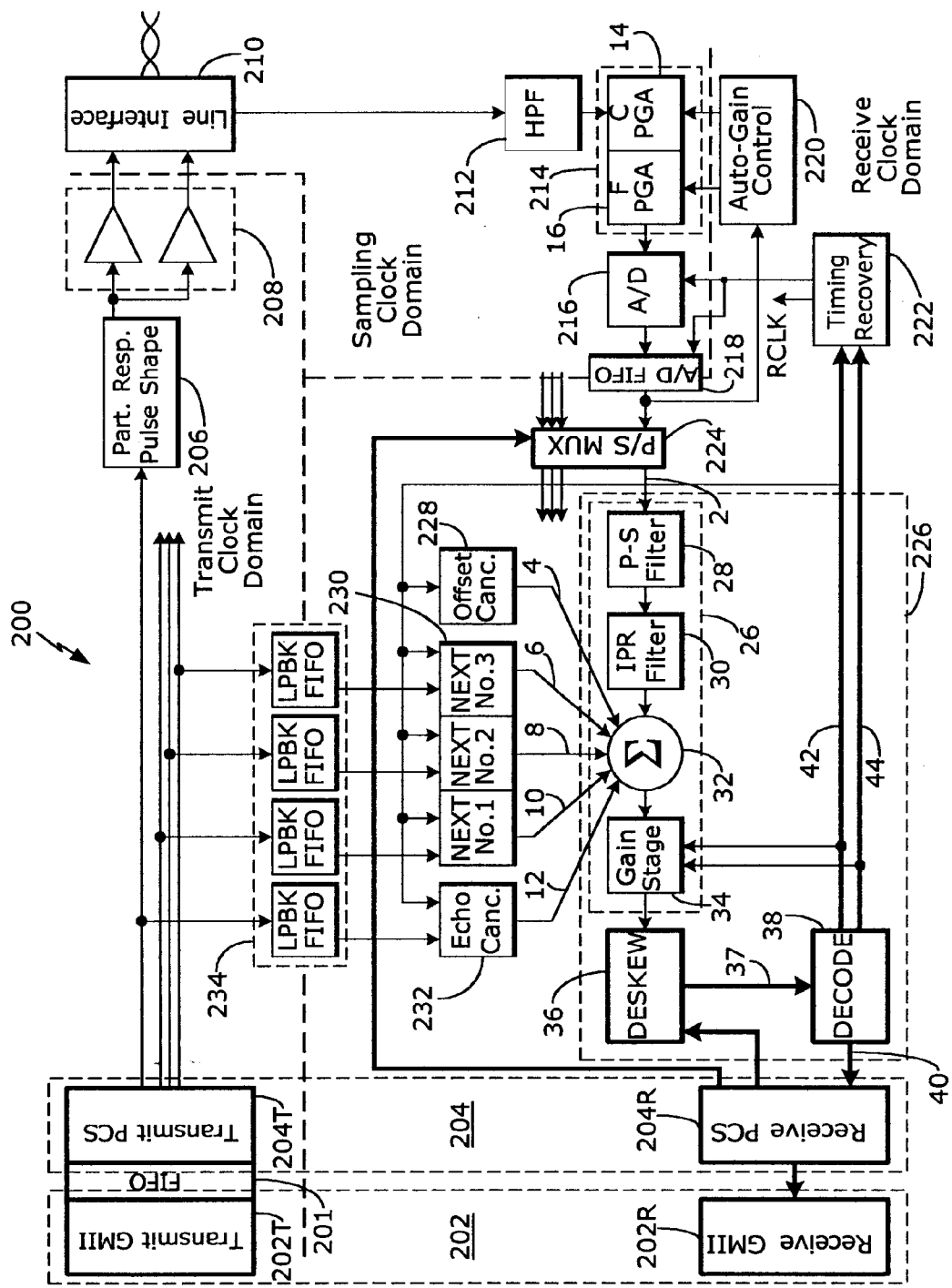
FIG. 2 is a block diagram of the gigabit transceiver.

FIG. 2 is a simplified block diagram of the functional architecture and internal construction of an exemplary transceiver block, indicated generally at 200, such as transceiver 102 of FIG. 1. Since the illustrative transceiver application relates to gigabit Ethernet transmission, the transceiver will be referred to as the "gigabit transceiver". For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 2 perform four-dimensional operations and carry four-dimensional (4-D) signals, respectively. By 4-D, it is meant that the data from the four constituent transceivers are used simultaneously. In order to clarify signal relationships in FIG. 2, thin lines correspond to 1-dimensional functions or signals (i.e., relating to only a single constituent transceiver), and thick lines correspond to 4-D functions or signals (relating to all four constituent transceivers).

Referring to FIG. 2, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an A/D first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the file elasticity requirement which is a function of frame size and frequency offset.

The PCS transmit section 204T performs certain scrambling operations and, in particular, is responsible for encoding digital data into the requisite codeword representations appropriate for transmission. In, the illustrated embodiment of FIG. 2, the transmit PCS section 204T incorporates a coding engine and signal mapper that implements a trellis coding architecture, such as required by the IEEE 802.3ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 2 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75+0.25z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/D converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (101 and 102 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma+z^{-1}$, with $\gamma$ equal to $\frac{1}{16}$ for short cables (less than 80 meters) and $\frac{1}{8}$ for long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1+Kz^{-1})$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceiver's analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 2, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bidirectional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach using the decision-feedback equalizer included inside the trellis decoder 38 to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 2, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 228, 229, 230, 231 and 232. Adaptation circuitry is used for the updating and training process of filter coefficients.

Figure 3A:
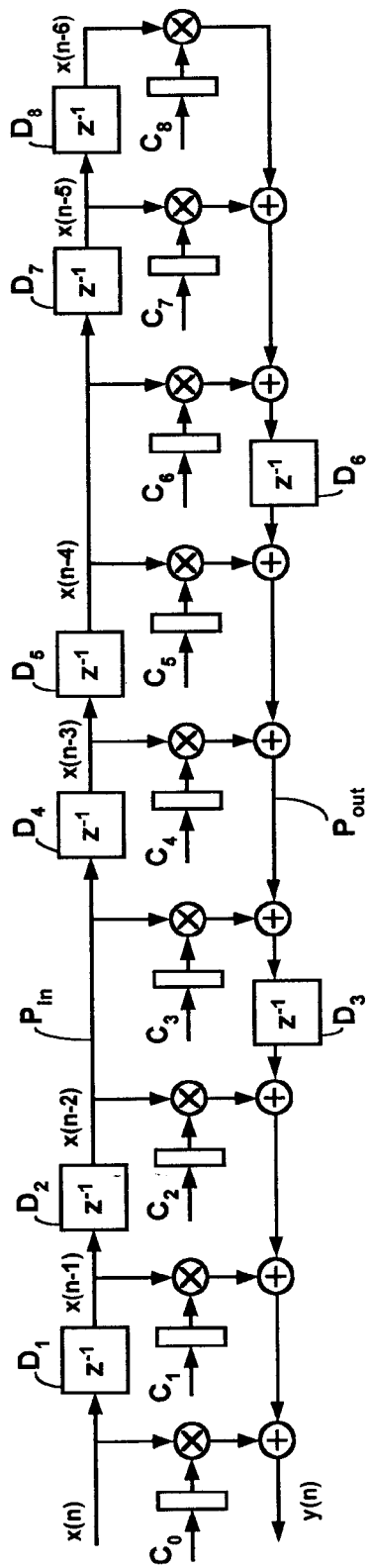
FIG. 3A is a simplified structure diagram of an adaptive FIR filter as might be implemented as an echo/NEXT canceller circuit in one embodiment of the gigabit transceiver.

The adaptive filters used to implement the echo canceller 232 and the NEXT cancellers 230 are typically finite impulse response (FIR) filters. FIG. 3A shows a structure of an adaptive FIR filter used as an echo/NEXT canceller in one embodiment of the gigabit transceiver.

Referring to FIG. 3A, the adaptive FIR filter includes an input signal path $P_{in}$, an output signal path $P_{out}$, and N taps (N is 9 in FIG. 3A). Each tap connects a point on the input signal path $P_{in}$ to a point on the output signal path Pout. Each tap, except for the last tap, includes a coefficient $C_i$, a multiplier $M_i$ and an adder $A_i$, i=0, . . .,N-2. The last tap includes the coefficient $C_{N-1}$, the multiplier $M_{N-1}$, and no adder. The coefficients $C_i$, where i=0, . . .,N-1, are stored in coefficient registers. During each adaptation process, the values of the coefficients $C_i$ are trained using a well-known least-mean-squares algorithm by an adaptation circuitry (not shown in FIG. 3A). After training, the coefficients $C_i$ converge to stable values. The FIR filter includes a set of delay elements $D_i$, where each delay element is implemented in the CMOS dynamic register 300 in FIG. 3A. The number of delay elements $D_i$ determines the order of the FIR filter. The output y(n), i.e., the filter output at time instant n, is a function of the input at time instant n and of the past inputs at time instants n-1 through n-(N-1), and is expressed as:

$$y(n) = \sum_{i=0}^{N-1} C_i x(n-i) \quad (1)$$

where x(n-i) denotes the input at time instant n-i, and N denotes the number of taps. The output y(n), as shown in Equation (1), is a weighted sum of the input data x(n-i), with i=0, . . .,N-1. The coefficients $C_i$ act as the weighting factors on the input data. If a coefficient $C_i$ has a very small absolute value, relative to the values of other coefficients, then the contribution of the corresponding input data x(n-i) to the value of y(n) is relatively insignificant.

Figure 3B:
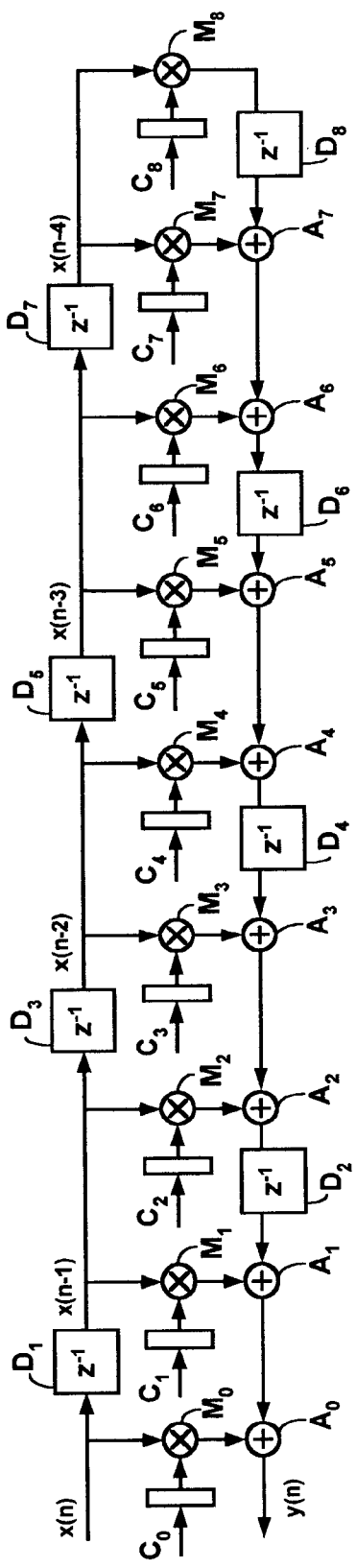
FIG. 3B is an equivalent structure of the adaptive FIR filter shown in FIG. 3A.

FIG. 3B is an equivalent structure of the filter shown in FIG. 3A. The two structures in FIGS. 3A and 3B provide the same filter transfer function, but differ in certain performance characteristics. The difference is due to the placement of the delay elements $D_i$, i=1, . . .,N-1 (N=9 in FIGS. 3A, 3B). If all the delay elements are placed in the input path $P_{in}$, as in the well-known direct form of the FIR filter, then the registers that are used to implement the delay elements are small, need only to be of the same size as the input data x(n). If all the delay elements are placed on the output path $P_{out}$, as in the well-known transposed form of the FIR filter, then the registers used as the delay elements must have more bits in order to hold the largest possible sum of products $C_i *x$(n-i). Large registers cost more and consume more power than small registers. Thus, the advantage of placing the delay elements on the input path instead of the output path is that fewer register bits are required. However, the larger the number of the delay elements on the input path, the lower the operating speed of the filter is.

If the propagation delay from the input of the filter to the last tap exceeds the required clock period, then the filter is not usable. To break the long propagation delay, that would occur if all the delay elements were placed on the input path $P_{in}$, into small delay intervals, some of the delay elements are placed on the output path $P_{out}$, at regular intervals, as shown in the filter structures in FIGS. 3A and 3B. The structure in FIG. 3B, which has a "two-to-one" split of delay elements between the input path and the output path, can operate at a higher clock speed than the structure in FIG. 3A, which has a "three-to-one" split. Computational results show that both of these structures are acceptable for use in a high-speed system such as the gigabit transceiver. The taps of the adaptive FIR filters used in the gigabit transceiver can be switched from an active state to an inactive state.

Each of the delay elements $D_i$ is implemented by a stack of individual CMOS dynamic registers, each of the individual CMOS dynamic registers handling one bit of data.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed is:

1. A method for reducing a propagation delay of a digital filter having an input path and an output path, the digital filter including a set of delay elements and a number of taps coupling the input path to the output path, each of the taps including a coefficient, a multiplier and an adder, each of the delay elements being disposed between two adjacent taps, the method comprising the operation of:

(a) placing the delay elements in both the input path and the output path of the digital filter, such that the digital filter has fewer delay elements in the input path than a direct-form digital filter having the same number of taps in a direct-form structure and has fewer delay elements in the output path than a transposed-form digital filter having the same number of taps in a transposed-form structure, and such that the digital filter has same transfer function as the direct-form digital filter and the transposed-form digital filter.

2. The method of claim 1 wherein the digital filter operates at a higher clock speed than a digital filter having the same number of taps in a direct-form structure and consumes less power than a digital filter having the same number of taps in a transposed-form structure.

3. The method of claim 1 wherein operation (a) comprises the operation of:

placing two consecutive delay elements in the input path corresponding to a first and second consecutive taps; and placing a delay element in the output path corresponding to a third tap consecutive to the first and second consecutive taps.

4. The method of claim 1 wherein operation (a) comprises the operation of:

placing one delay element in the input path corresponding to a first tap; and placing a delay element in the output path corresponding to a tap consecutive to the first tap.

5. The method of claim 1 wherein the digital filter is included in a gigabit transceiver.

6. The method of claim 1 wherein the digital filter is an echo canceller.

7. The method of claim 1 wherein the digital filter is a near-end cross-talk (NEXT) canceller.

8. The method of claim 1 wherein the digital filter is a far-end cross-talk (FEXT) canceller.

9. The method of claim 1 wherein the digital filter is a decision feedback equalizer.

10. The method of claim 1 wherein the digital filter is an adaptive filter.

11. A digital filter having a reduced propagation delay, the digital filter having an input path and an output path, and including a set of delay elements and a number of taps, each of the taps including a coefficient, a multiplier and an adder, each of the delay elements being disposed between two adjacent taps, the digital filter comprising:

(a) an input path;

(b) an output path;

(c) a number of taps coupling the input path to the output path, each of the taps including a coefficient, a multiplier and an adder;

(d) a set of delay elements, each of the delay elements being disposed between two adjacent taps, the delay elements being disposed in both the input path and the output path of the digital filter, such that the digital filter has fewer delay elements in the input path than a direct-form digital filter having the same number of taps in a direct-form structure and has fewer delay elements in the output path than a transposed-form digital filter having the same number of taps in a transposed-form structure, and such that the digital filter has same transfer function as the direct-form digital filter and the transposed-form digital filter.

12. The digital filter of claim 11 wherein the digital filter operates at a higher clock speed than a digital filter having the same number of taps in a direct-form structure and consumes less power than a digital filter having the same number of taps in a transposed-form structure.

13. The digital filter of claim 11 wherein the digital filter comprises:

two consecutive delay elements in the input path corresponding to a first and second consecutive taps; and a delay element in the output path corresponding to a third tap consecutive to the first and second consecutive taps.

14. The digital filter of claim 11 wherein the digital filter comprises:

a delay element in the input path corresponding to a first tap; and a delay element in the output path corresponding to a tap consecutive to the first tap.

15. The digital filter of claim 11 wherein the digital filter is included in a gigabit transceiver.

16. The digital filter of claim 11 wherein the digital filter is an echo canceller.

17. The digital filter of claim 11 wherein the digital filter is a near-end cross-talk (NEXT) canceller.

18. The digital filter of claim 11 wherein the digital filter is a far-end cross-talk (FEXT) canceller.

19. The digital filter of claim 11 wherein the digital filter is a decision feedback equalizer.

20. The digital filter of claim 11 wherein the digital filter is an adaptive filter.

* * * * *